(12) United States Patent
Xie et al.

(10) Patent No.: US 9,245,885 B1
(45) Date of Patent: Jan. 26, 2016

(54) METHODS OF FORMING LATERAL AND VERTICAL FINFET DEVICES AND THE RESULTING PRODUCT

(71) Applicant: GLOBALFOUNDRIES Inc., Grand Cayman (KY)

(72) Inventors: Ruilong Xie, Niskayuna, NY (US); Andreas Knorr, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/674,656

(22) Filed: Mar. 31, 2015

Related U.S. Application Data

(60) Provisional application No. 62/088,099, filed on Dec. 5, 2014.

(51) Int. Cl.

| | |
|---|---|
| *H01L 21/336* | (2006.01) |
| *H01L 27/088* | (2006.01) |
| *H01L 29/78* | (2006.01) |
| *H01L 29/66* | (2006.01) |
| *H01L 21/8234* | (2006.01) |

(52) U.S. Cl.
CPC .... *H01L 27/0886* (2013.01); *H01L 21/823431* (2013.01); *H01L 29/6656* (2013.01); *H01L 29/66545* (2013.01); *H01L 29/66795* (2013.01); *H01L 29/785* (2013.01); *H01L 29/7827* (2013.01)

(58) Field of Classification Search
CPC .................................................... H01L 27/0886
USPC ......................................................... 257/401
See application file for complete search history.

(56) References Cited

U.S. PATENT DOCUMENTS

2015/0028419 A1\* 1/2015 Cheng .................. H01L 21/845
257/347

\* cited by examiner

*Primary Examiner* — Anthony Ho
(74) *Attorney, Agent, or Firm* — Amerson Law Firm, PLLC

(57) ABSTRACT

One illustrative method disclosed herein includes, among other things, forming first and second recessed gate structures, recessing the second recessed gate structure so as to define a further recessed second gate structure that exposes a channel structure within a gate cavity, forming first and second gate cap layers in first and second replacement gate cavities, respectively, forming a recess in the second gate cap layer that exposes the channel structure, forming a semiconductor material on the exposed portion of the channel structure within the recess in the second gate cap layer so as to define a first source/drain region for the vertical FinFET device, and forming various contact structures to the gates of the devices and the first source/drain region.

17 Claims, 21 Drawing Sheets

METHODS OF FORMING LATERAL AND VERTICAL FINFET DEVICES AND THE RESULTING PRODUCT

BACKGROUND OF THE INVENTION

1. Field of the Invention

Generally, the present disclosure relates to the manufacture of semiconductor devices, and, more specifically, to various novel methods of forming lateral and vertical FinFET devices and the resulting integrated circuit product.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

As it relates to FinFET devices, there are so-called lateral FinFET devices and vertical FinFET devices, the basic structure of which is well known to those skilled in the art. In general, when viewing a lateral FinFET device from above, the source/drain regions are positioned on opposite sides of the gate structure of the device. In contrast, when viewing a vertical FinFET device from above, the channel region of the device is positioned vertically below one of the source/drain regions while the other source/drain region is positioned vertically below the channel region, i.e., the channel region is positioned vertically between a lower source/drain region and an upper source/drain region. Unlike a lateral FinFET device, a vertical FinFET device is not symmetrical with respect to how it may be wired in the integrated circuit. That is, the electrical characteristics of a vertical FinFET device are different depending upon the direction of current flow, i.e., top-to-bottom or bottom-to-top. Thus, the use of traditional non-symmetric vertical FinFET devices limits design flexibility. In some applications, it is desirable to form both lateral FinFET devices and vertical FinFET devices on the same integrated circuit product. However, a process flow must be developed for forming both types of FinFET devices that is efficient and may be incorporated in a mass production manufacturing environment.

The present disclosure is directed to methods of forming lateral and vertical FinFET devices and the resulting integrated circuit product that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming lateral and vertical FinFET devices and the resulting integrated circuit product. One illustrative method disclosed herein includes, among other things, forming first and second replacement gate cavities for a lateral FinFET device and a vertical FinFET device, respectively, forming first and second recessed gate structures in first and second replacement gate cavities and, while masking the first recessed gate structure with a first masking layer, performing a recess etching process on the second recessed gate structure so as to define a further recessed second gate structure and to expose at least a portion of the channel structure within the second gate cavity. In this embodiment, the method further comprises forming first and second gate cap layers in the first and second replacement gate cavities, respectively, while masking the first gate cap layer with a second masking layer, forming a recess in the second gate cap layer that exposes at least a portion of the channel structure, forming a semiconductor material on the exposed portion of the channel structure within the recess in the second gate cap layer, the semiconductor material defining a first source/drain region for the vertical FinFET device, and forming a first gate contact structure for the first recessed gate structure, a second gate contact structure for the further recessed second gate structure and a first source/drain contact structure for the first source/drain region of the vertical FinFET device.

One example of a novel integrated circuit product disclosed herein includes, among other things, a lateral FinFET device comprising a first gate structure having a first upper surface positioned above a semiconductor substrate and a vertical FinFET device comprising a second gate structure having a second upper surface positioned above a semiconductor substrate, wherein the first upper surface of the first gate structure is positioned at a first height level above a reference surface of the semiconductor substrate, the second upper surface of the second gate structure is positioned at a second height level above the reference surface of the semiconductor substrate, the first height level being greater than the second height level, and wherein the first and second gate structures are made of the same materials.

BRIEF DESCRIPTION OF THE DRAWINGS

The disclosure may be understood by reference to the following description taken in conjunction with the accompanying drawings, in which like reference numerals identify like elements, and in which.

Figure 1A:
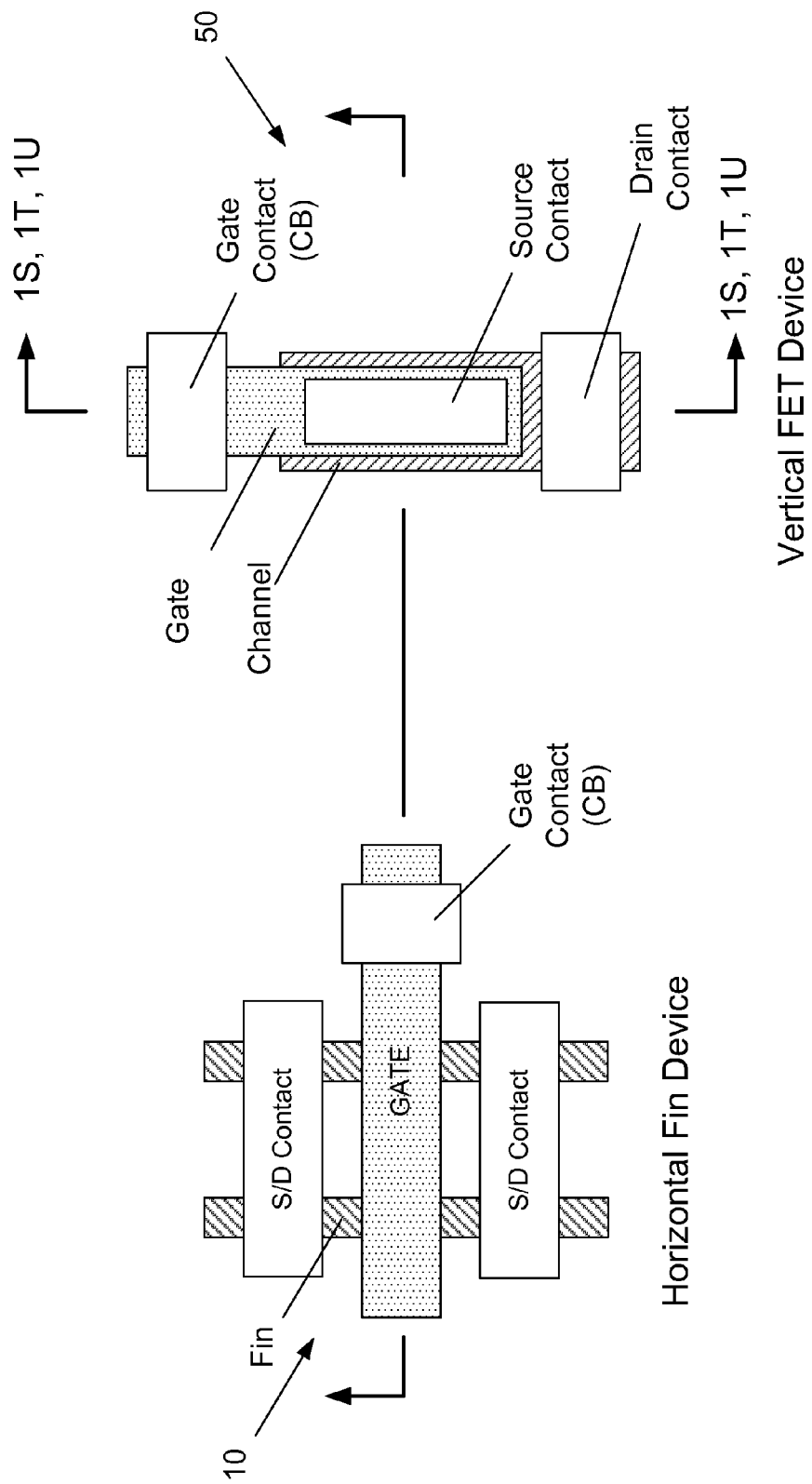
FIGS. 1A-1U depict various illustrative novel methods disclosed herein for forming lateral and vertical FinFET devices and the resulting integrated circuit product.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit product 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIG. 1A is a simplistic plan view of an illustrative lateral FinFET device 10 and a vertical FinFET device 50. The gate structures, source/drain contact structures and gate contact structures are also schematically depicted for the devices 10, 50. The horizontally oriented section arrow depicts where various cross-sectional drawings included herein are taken through both of the devices 10, 50. As indicated in FIG. 1A, drawings 1S, 1T and 1U are cross-sectional views taken through the vertical FinFET device 50 only. The lateral FinFET device 10 is depicted as only having two illustrative fins, but in practice it may have any desired number of fins, i.e., one or more.

Figure 1B:
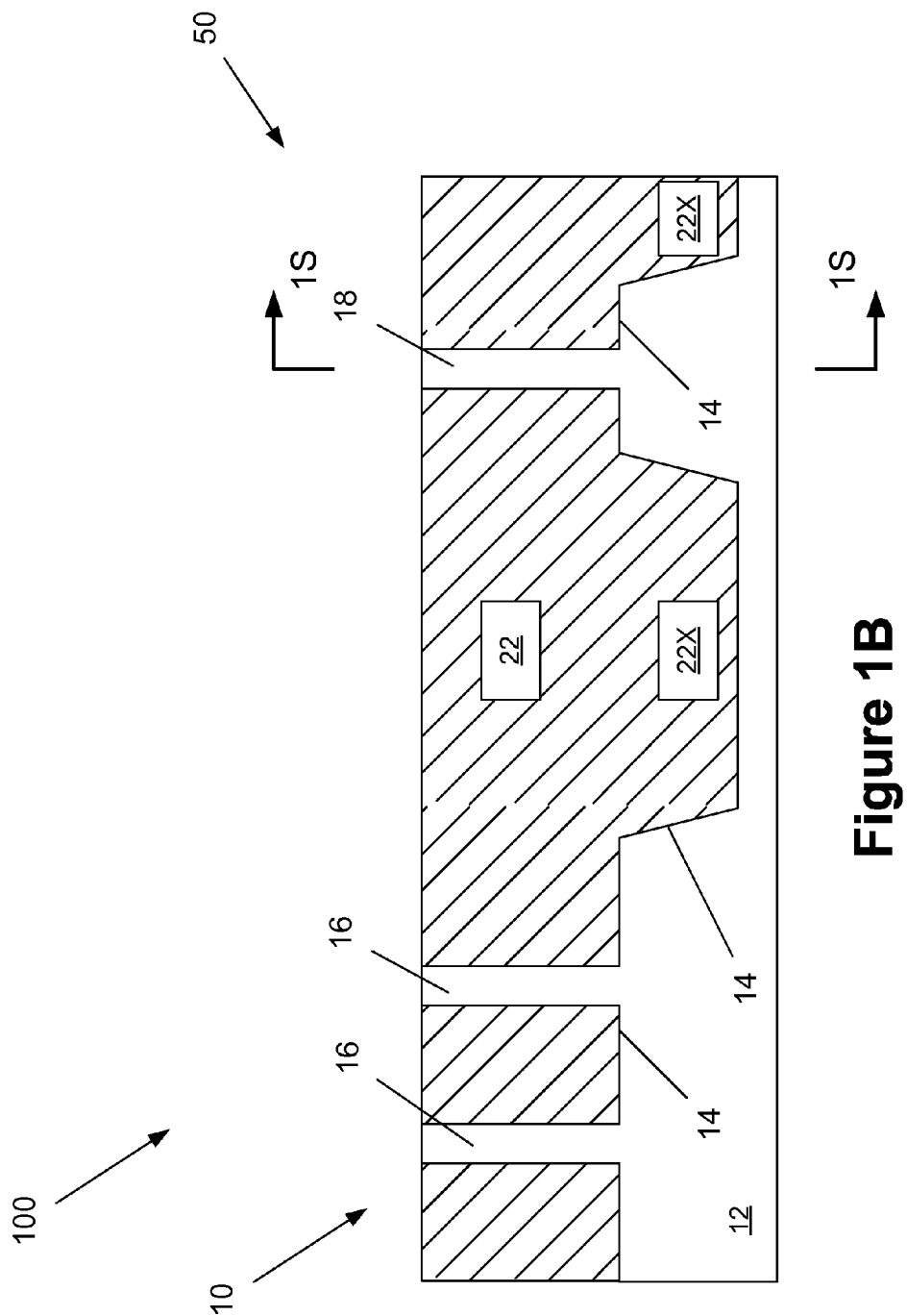

FIG. 1B depicts the integrated circuit product 100 at an early stage of fabrication wherein several process operations have already been performed. In general, the product 100 will be formed in and above a substrate 12. The substrate 12 may have a variety of configurations, such as the depicted bulk silicon configuration. The substrate 12 may also have a silicon-on-insulator (SOI) configuration that includes a bulk silicon layer, a buried insulation layer and an active layer, wherein semiconductor devices are formed in and above the active layer. The substrate 12 may be made of silicon or it may be made of materials other than silicon. Thus, the terms "substrate" or "semiconductor substrate" should be understood to cover all semiconducting materials and all forms of such materials.

With continuing reference to FIG. 1B, the product 100 is depicted after a common etching process was performed through a patterned masking layer (not shown) to define a plurality of trenches 14 in the substrate 12. The trenches 14 define a plurality of fins 16 for the lateral FinFET device 10 and a channel structure 18 for the vertical FinFET device 50. At least a portion of the channel structure 18 will define the channel region for the vertical FinFET device 50 when fabrication is complete. FIG. 1B also depicts the product 100 after a layer of insulating material 22, such as silicon dioxide, was formed so as to overfill the final trenches 14. A chemical mechanical polishing (CMP) process was then performed to planarize the upper surface of the insulating material 22 and to remove the patterned hard mask layer. Due to the fact that some of the trenches 14 were formed to a greater depth, filling the deeper trenches with the insulating material 22 results in the formation of device isolation regions 22X. FIG. 1S is a cross-sectional view of the vertical FinFET device 50 taken where indicated in FIG. 1B. As indicated, the vertical FinFET device 50 is patterned such that an extended portion 12A of the substrate 12 is positioned adjacent to the channel structure 18. The dimensions of the portion 12A may vary depending upon the particular application.

The fins 16 and the channel structure 18 may be formed to any desired height or width. In the illustrative example depicted in the attached figures, the trenches 14 and the fins 16 are all of a uniform size and shape. However, such uniformity in the size and shape of the trenches 14 and the fins 16 is not required to practice at least some aspects of the inventions disclosed herein. In the example depicted herein, the trenches 14 are depicted as having been formed by performing an anisotropic etching process. In some cases, the trenches 14 may have a reentrant profile near the bottom of the trenches 14. To the extent the trenches 14 are formed by performing a wet etching process, the trenches 14 may tend to have a more rounded configuration or non-linear configuration as compared to the generally linear configuration of the trenches 14 that are formed by performing an anisotropic etching process. In other cases, the trenches 14 may be formed in such a manner that the fins 16 have a tapered cross-sectional configuration (wider at the bottom than at the top at this point in the process flow). Thus, the size and configuration of the trenches 14, the fins 16 and the channel structure 18 and the manner in which they are made should not be considered a limitation of the present invention.

Figure 1C:
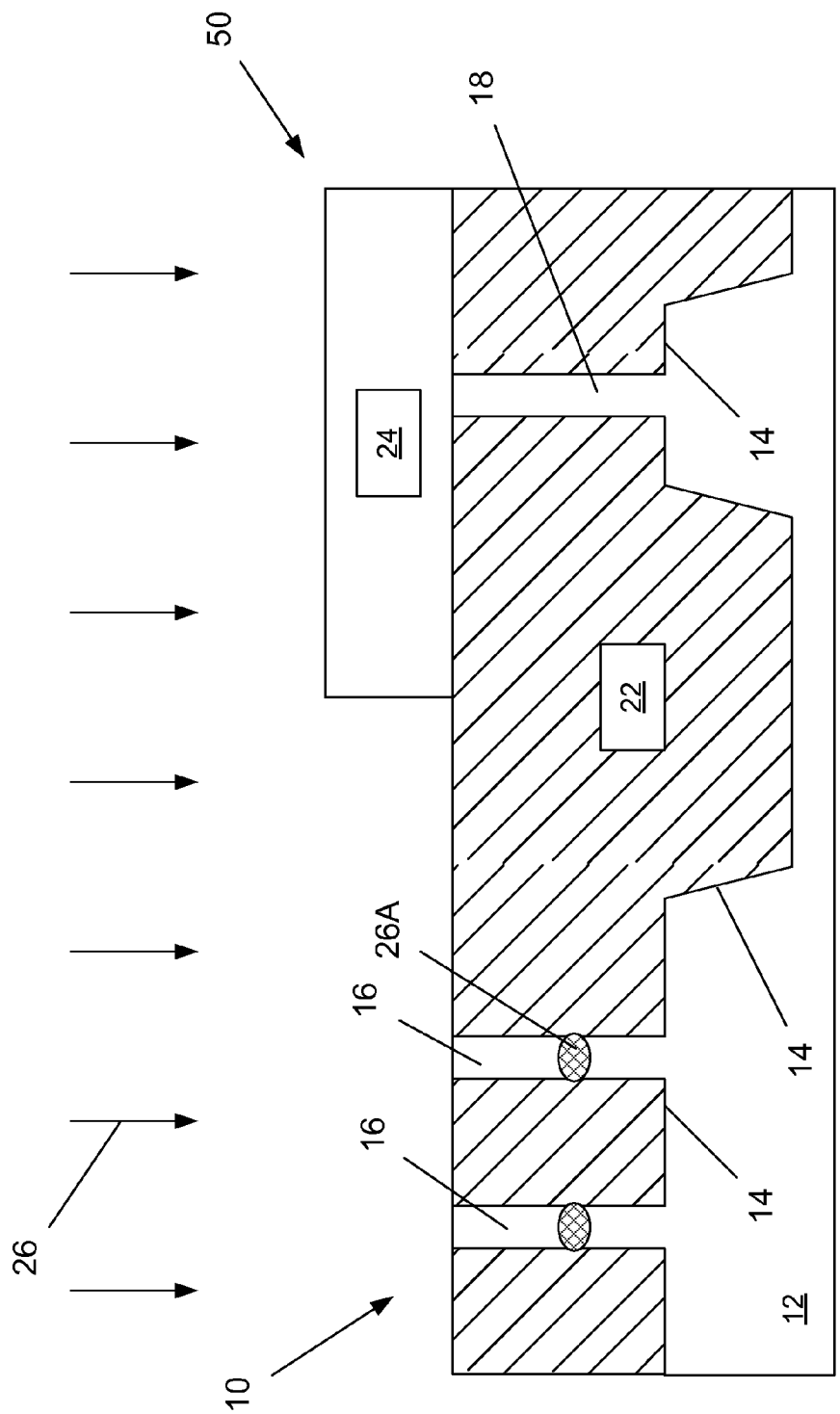

FIG. 1C depicts the product 100 after a patterned masking layer 24, e.g., a patterned layer of photoresist, was formed above the layer of insulating material 22. The patterned layer of photoresist 22 covers the vertical FinFET device 50 and exposes the lateral FinFET device 10. An illustrative ion implantation process 26, i.e., a so-called punch stop implant process, was performed through the patterned masking layer 24 to form illustrative punch stop implants 26A in the fins 16 at a desired depth. The implanted materials, implant dose and implant energy during the implantation process 26 may all vary depending upon the particular application.

Figure 1D:
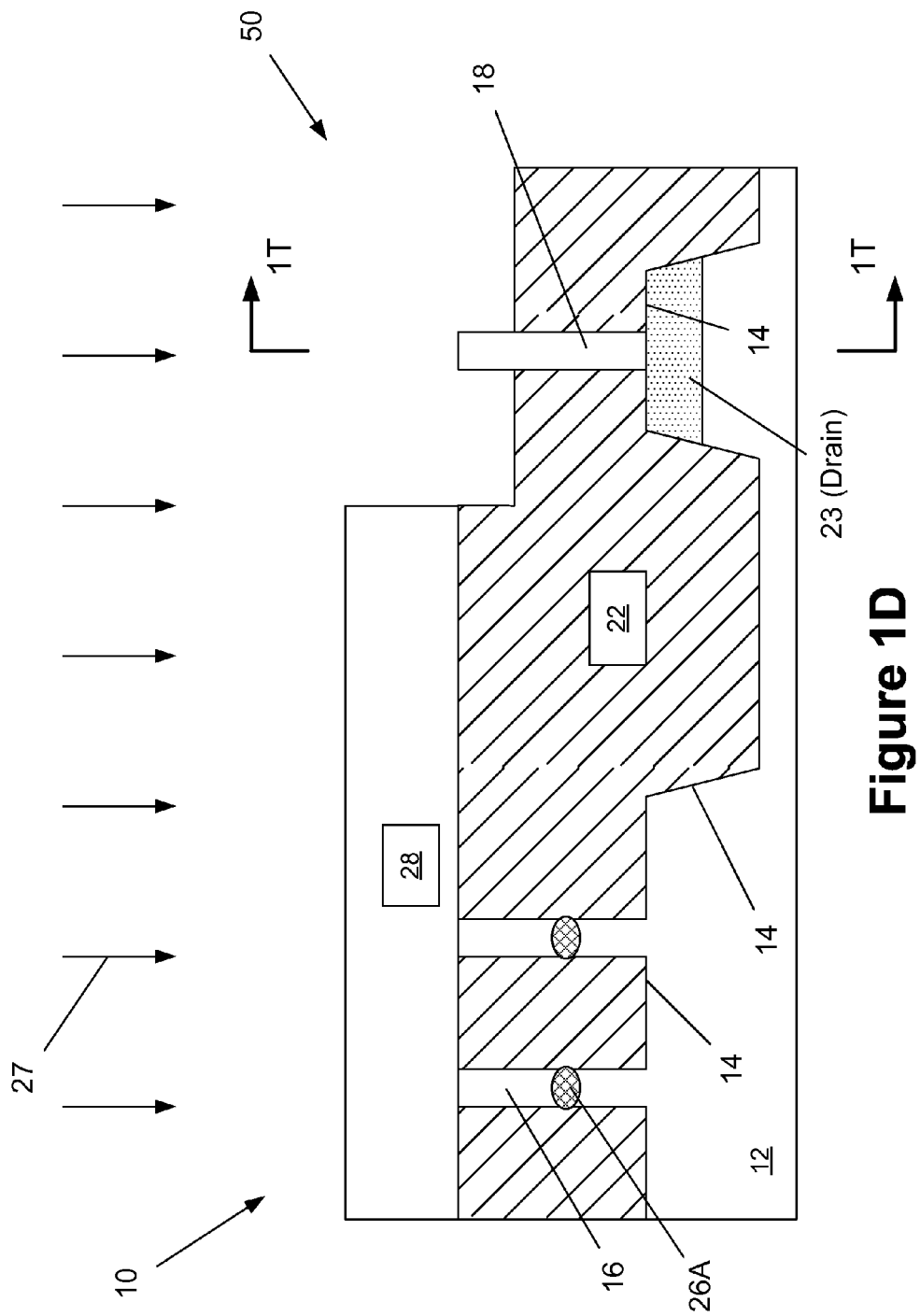

FIG. 1D depicts the product 100 after several process operations were performed. First the patterned masking layer 24 was removed. Thereafter, a second a patterned masking layer 28, e.g., a patterned layer of photoresist, was formed above the layer of insulating material 22. The patterned masking layer 28 covers the lateral FinFET device 10 and exposes the vertical FinFET device 50. Next, with reference to FIGS. 1D and 1T, an ion implantation process 27 was performed through the patterned masking layer 28 to form a doped drain region 23 in the substrate 12 under the channel structure 18 and in the extended portion 12A of the substrate 12. The implanted dopant materials, implant dose and implant energy during the implantation process 27 may all vary depending upon the particular application. Thereafter, a recess etching process was performed on the exposed portion of the layer of insulating material 22 above the vertical FinFET device 50. The amount of such recessing may vary depending upon the particular application. Although the region 23 is described as being a drain region, it is a generic source/drain region that could function as either a drain region or a source region for the vertical FinFET device 50. It should also be noted that, if desired, the implant process 27 could be performed after the layer of insulating material 22 is recessed. Moreover, in the illustrative process flow depicted herein, the lateral FinFET device 10 is subjected to the above processing operations prior to processing the vertical FinFET device 50. In practice, the above-described processing operations could be reversed, i.e., the vertical FinFET device 50 could be processed prior to the lateral FinFET device 10.

Figure 1E:
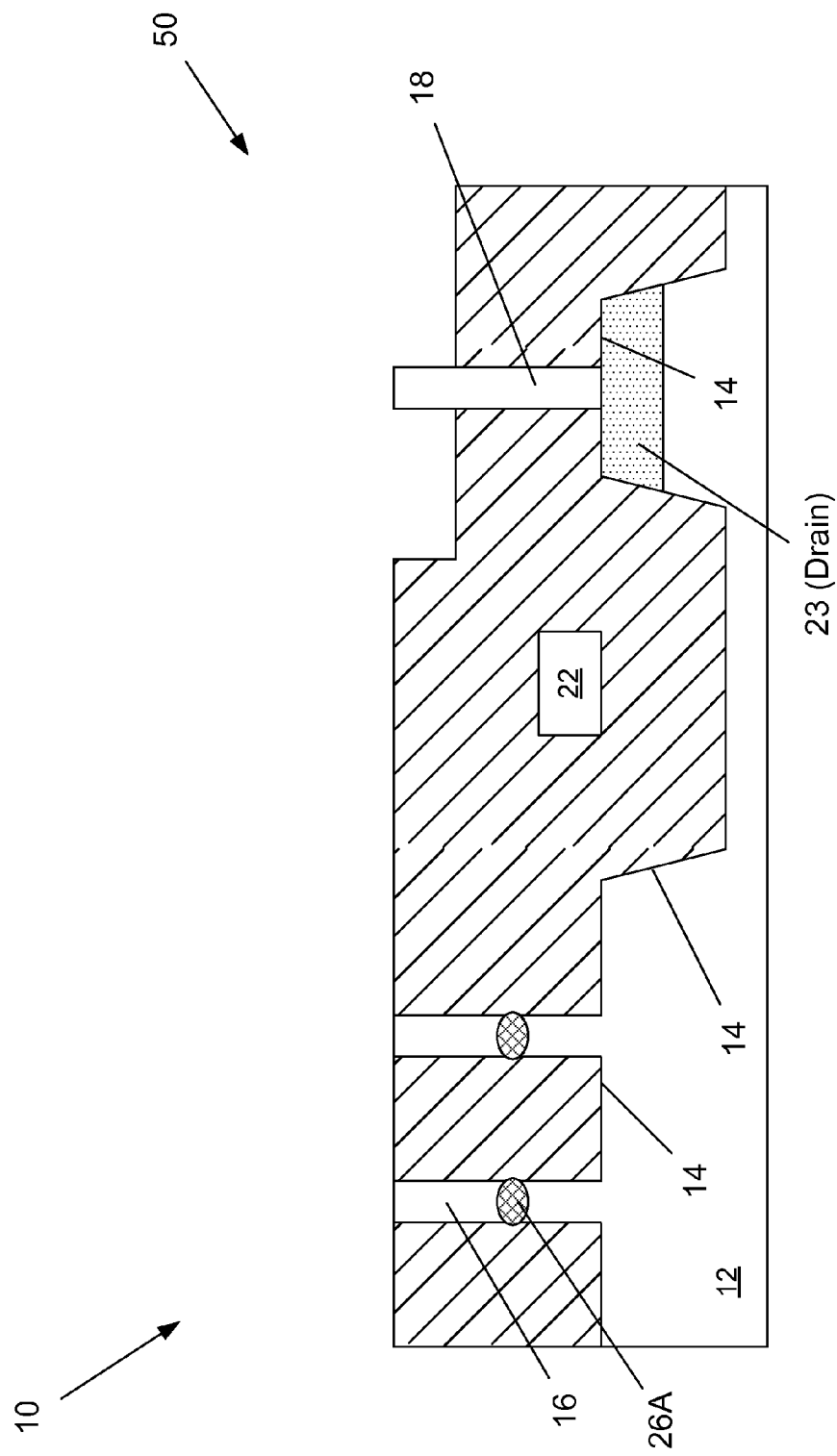

FIG. 1E depicts the product 100 after the patterned masking layer 28 was removed from the product.

Figure 1F:
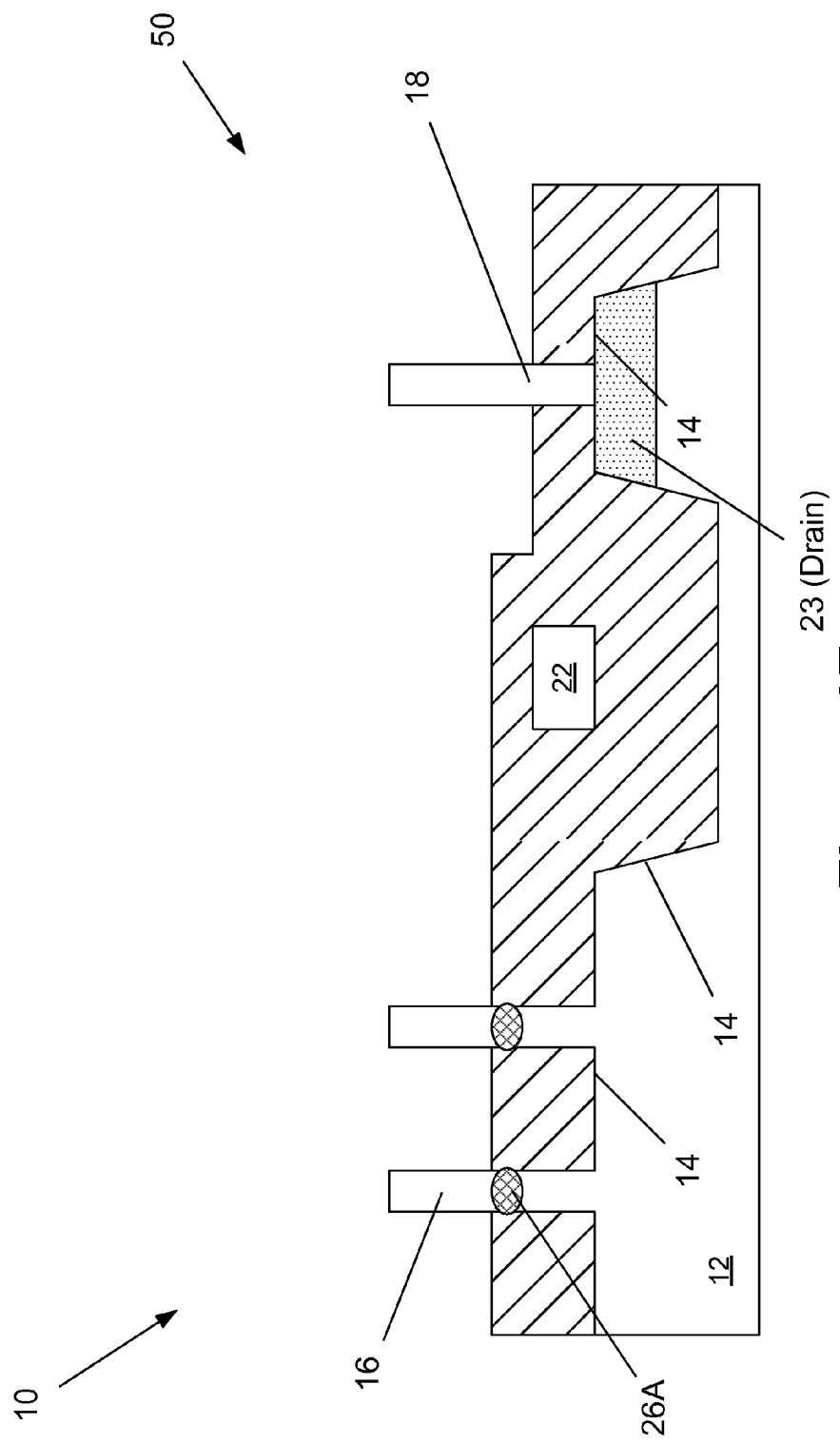

FIG. 1F depicts the product 100 after another recess etching process was performed on the portions of the layer of insulating material 22 positioned above both the lateral FinFET device 10 and the vertical FinFET device 50. The amount of such recessing may vary depending upon the particular application. This recess etching process exposes the final fin height for the fins 16 of the lateral FinFET device 10. Due to the previous selective recessing of the insulating material 22 above the vertical FinFET device 50, more, i.e., a greater height, of the channel structure 18 is exposed as compared to fins 16.

Figure 1G:
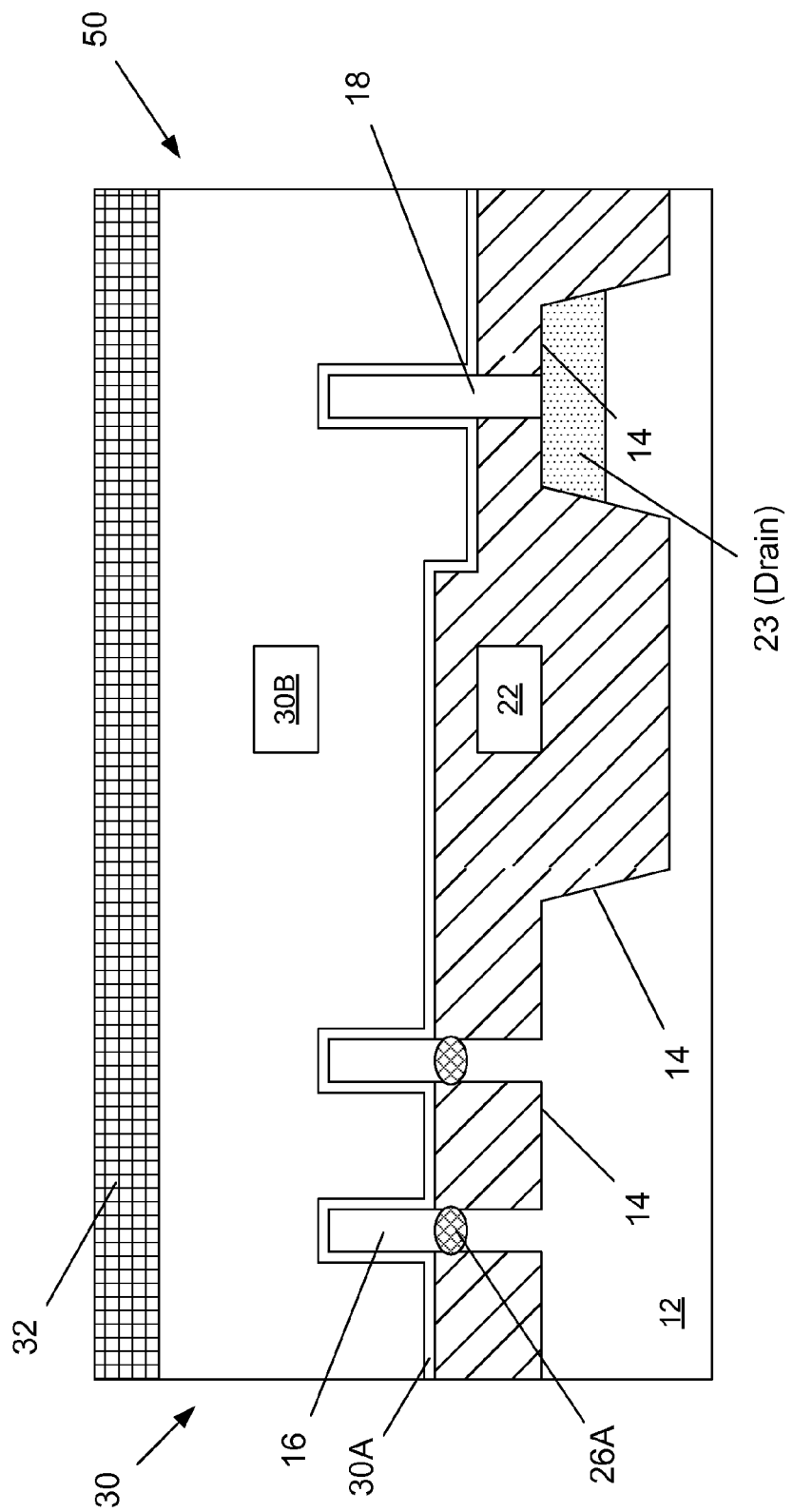

The inventions disclosed herein will be disclosed in the context of forming gate structures for the devices 10, 50 by performing a replacement gate process. Accordingly, FIG. 1G depicts the product 100 after materials for sacrificial gate structures 30 are formed above both the lateral FinFET device 10 and the vertical FinFET device 50. The sacrificial gate structures 30 are intended to be representative in nature of any type of sacrificial gate structure that may be employed in manufacturing integrated circuit products using so-called gate-last (replacement gate) manufacturing techniques. In general, the sacrificial gate structures 30 are comprised of a sacrificial gate insulation layer 30A, such as silicon dioxide, and a sacrificial gate electrode 30B, such as polysilicon or amorphous silicon. Also depicted is an illustrative gate cap layer 32 (e.g., silicon nitride). In one illustrative replacement gate manufacturing technique, the layers of material for the sacrificial gate structure 30 and the gate cap layer 32 may be initially formed/deposited above the substrate 12.

Figure 1H:
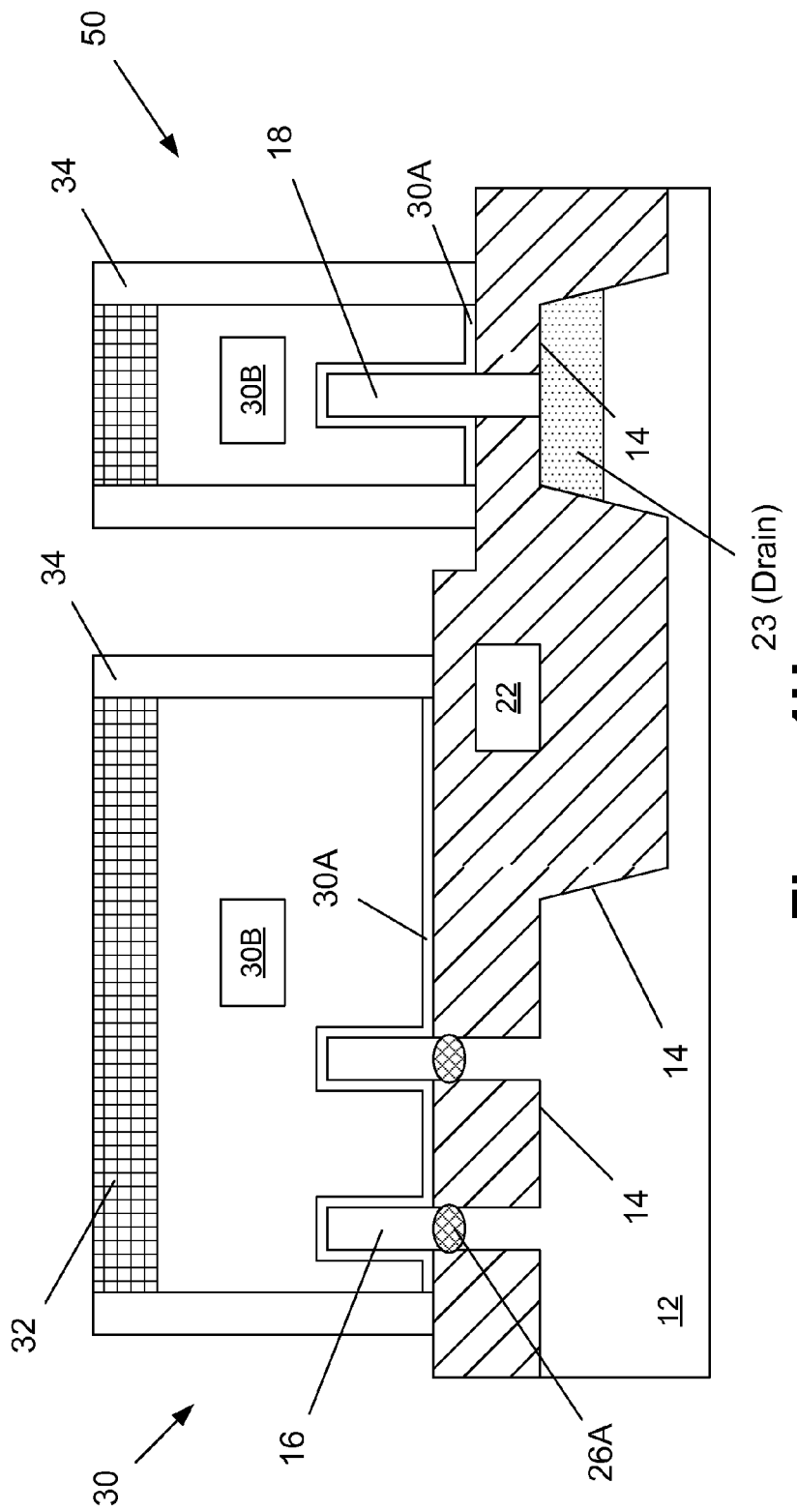

FIG. 1H depicts the product 100 after the materials for the sacrificial gate structures 30 and the gate cap layer 32 were patterned using traditional masking and etching techniques. This process results in the formation of separate sacrificial gate structures 30 above the lateral FinFET device 10 and the vertical FinFET device 50. Thereafter, sidewall spacers 34 were formed adjacent the patterned sacrificial gate structures 30. The spacers 34 were formed by depositing a layer of spacer material and thereafter performing an anisotropic etching process.

Figure 1I:
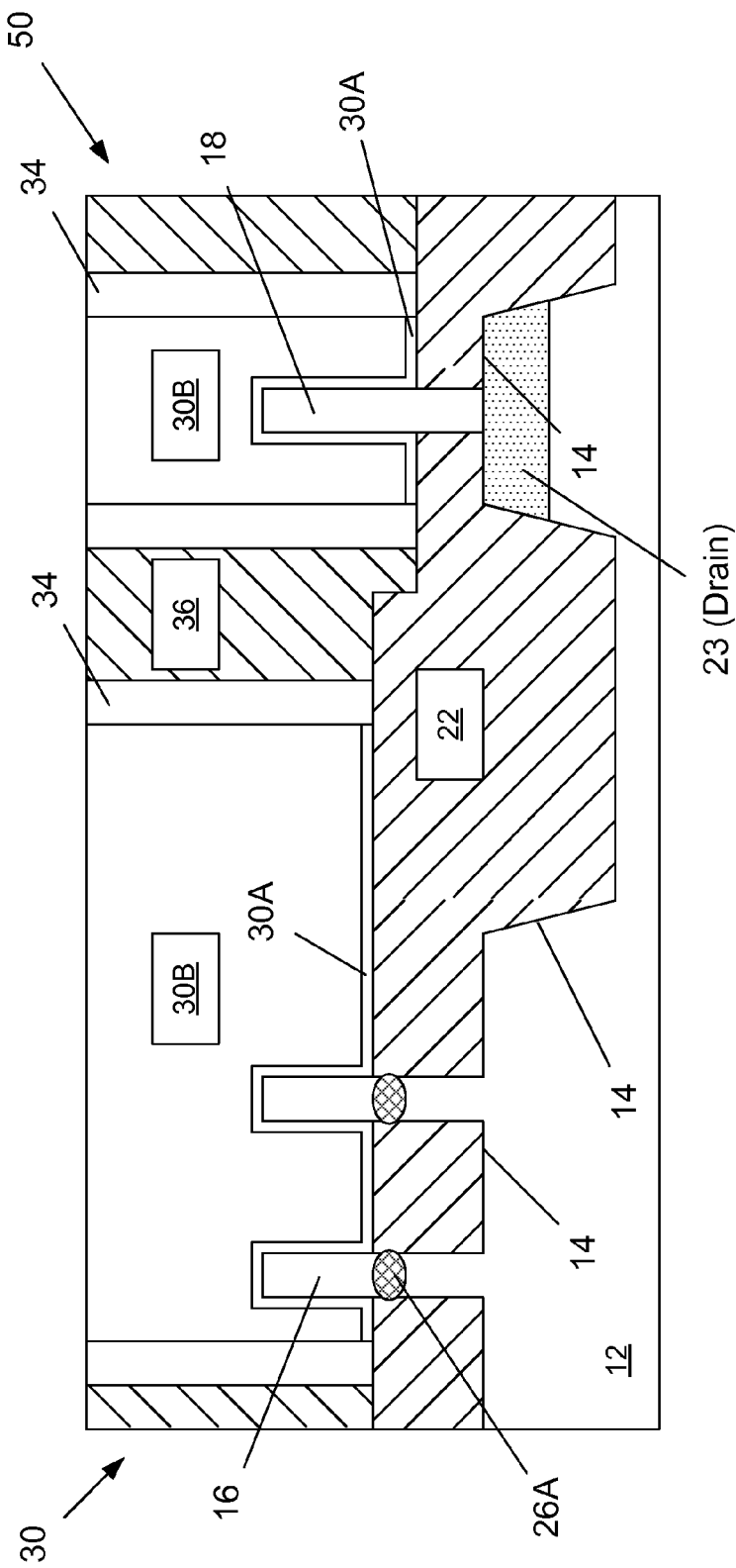

FIG. 1I depicts the product 100 after another layer of insulating material 36, such as silicon dioxide, was formed so as to overfill the spaces between the sidewall spacers 34, and after one or more chemical mechanical polishing (CMP) processes were performed to planarize the upper surface of the insulating material 36 with the upper surface of the sacrificial gate structures 30 so as to thereby expose the sacrificial gate electrodes 30B. As depicted, these process operations result in the removal of the gate cap layers 32.

Figure 1J:
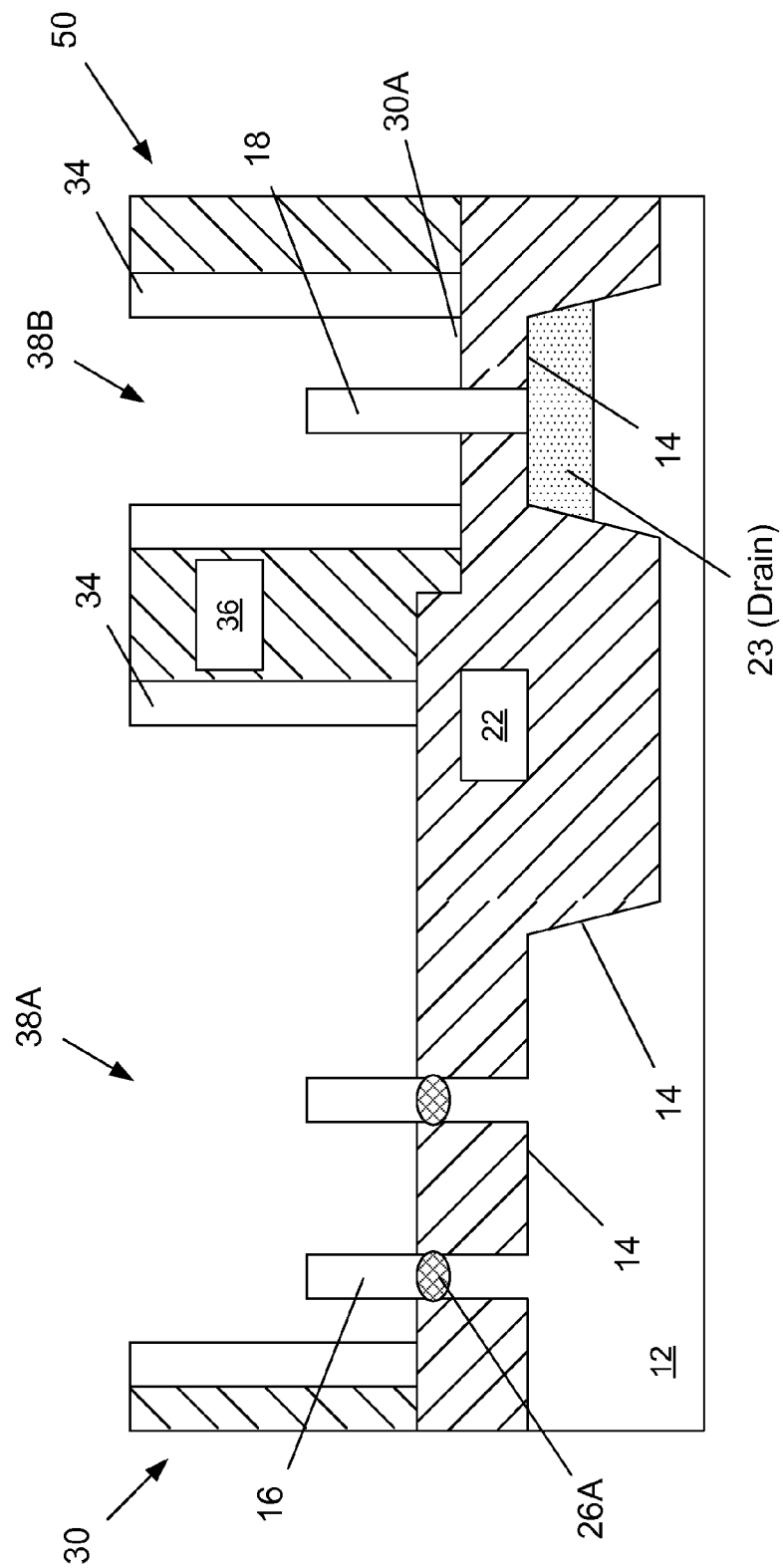

FIG. 1J depicts the product 100 after one or more etching processes were performed to remove the sacrificial gate structures 30, which results in the formation of a plurality of replacement gate cavities 38A, 38B (generally referred to with the reference number 38) for the devices 10, 50, respectively. The replacement gate cavities 38 are laterally defined by the spacers 34. Final replacement gate structures for the devices 10, 50 will be formed in the replacement gate cavities 38.

Figure 1K:
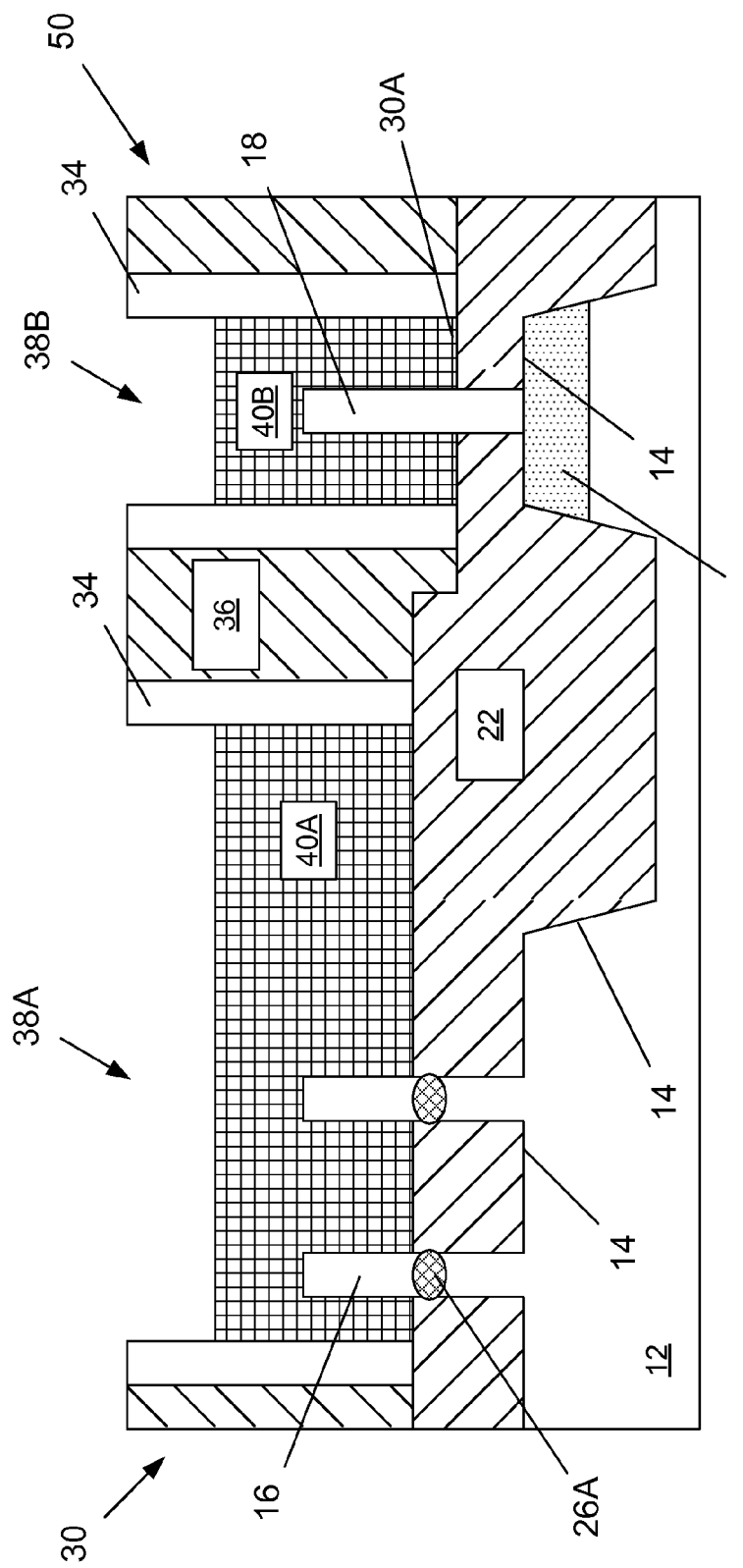

FIG. 1K depicts the product 100 after illustrative and schematically depicted recessed replacement (or final) gate structures 40A, 40B (generally referred to with the reference number 40) were formed in the gate cavities 38 for the devices 10, 50, respectively. As indicated, the final gate structures 40 for both of the devices 10, 50 are made of the same materials. The gate structures 40 depicted herein are intended to be representative in nature of any type of replacement gate structure that may be employed in manufacturing integrated circuit products. Typically, a pre-clean process will be performed in an attempt to remove all foreign materials from within the gate cavities 38 prior to forming the various layers of material that will become part of the gate structures 40. Thereafter, the final gate structures 40 may be formed by sequentially depositing the materials of the gate structures into the gate cavities 38 and above the layer of insulating material 36 and then performing a CMP process to remove excess materials above the layer of insulating material 36. FIG. 1K depicts the product after one or more recess etching processes were performed to recess the gate materials for the final gate structures 40. The amount of such recessing of the gate materials may vary depending upon the particular application.

Figure 1L:
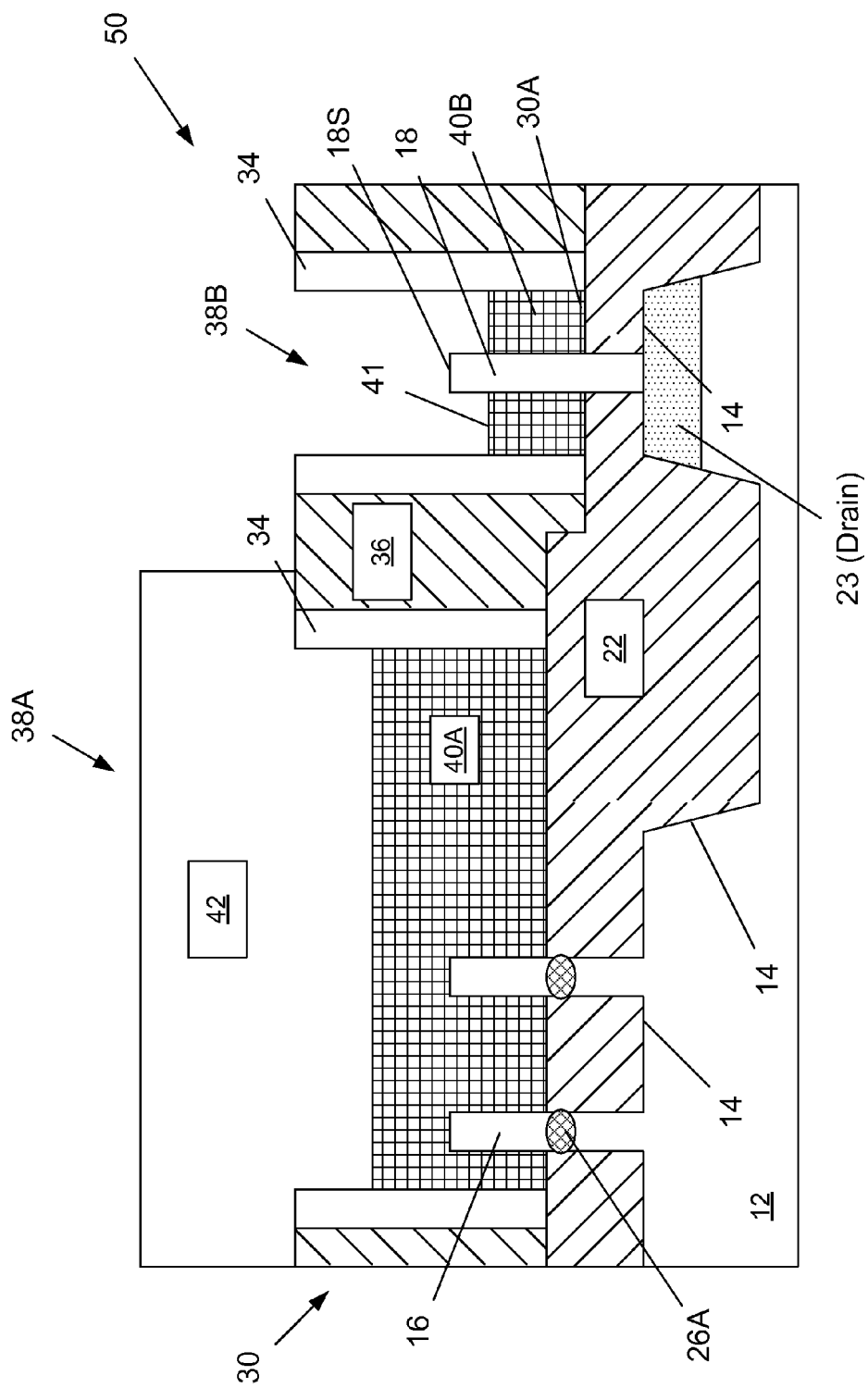

FIG. 1L depicts the product after several process operations were performed. First, a patterned masking layer 42, e.g., a patterned layer of photoresist, was formed above the product 100. The patterned masking layer 42 covers the lateral FinFET device 10 and exposes the vertical FinFET device 50, and, more particularly, the final gate structure 40B for the vertical FinFET device 50. Thereafter, a timed, recess etching process was performed to further recess the gate materials of the gate structure 40B until such time as the further recessed upper surface 41 of the gate structure 40B is positioned below an upper surface 18S of the channel structure 18. The amount of the channel structure 18 exposed above the upper surface 41 may vary depending upon the particular application, e.g., 5-10 nm. The further recessed gate structure 40B has an upper surface that is at a height level that is less than a height level of an upper surface of the recessed gate structure 40A for the lateral FinFET device 10, relative to a reference surface of the substrate, such as the original, horizontally-oriented upper surface of the substrate 12.

Figure 1M:
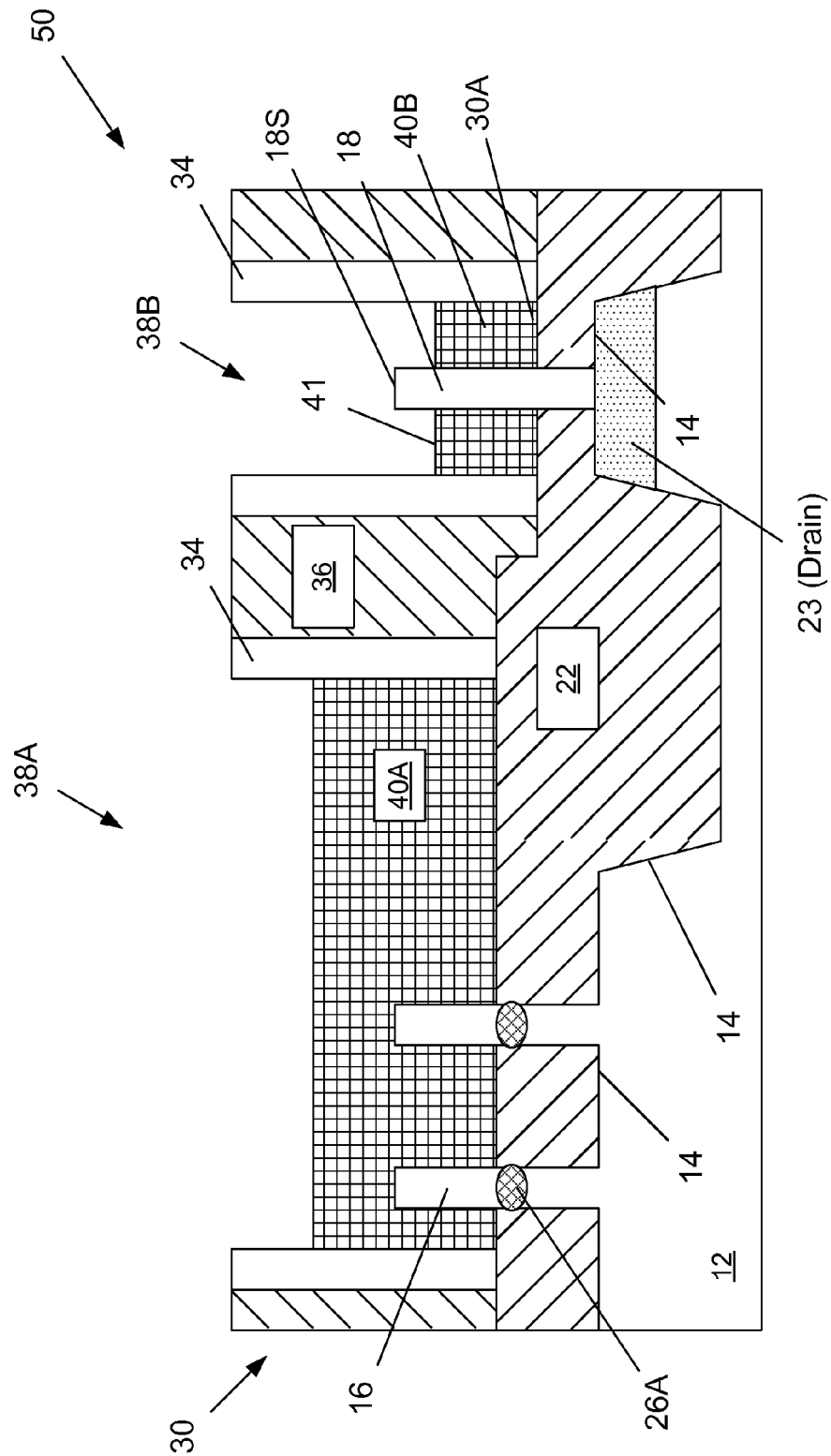

FIG. 1M depicts the product 100 after the patterned masking layer 42 was removed.

Figure 1N:
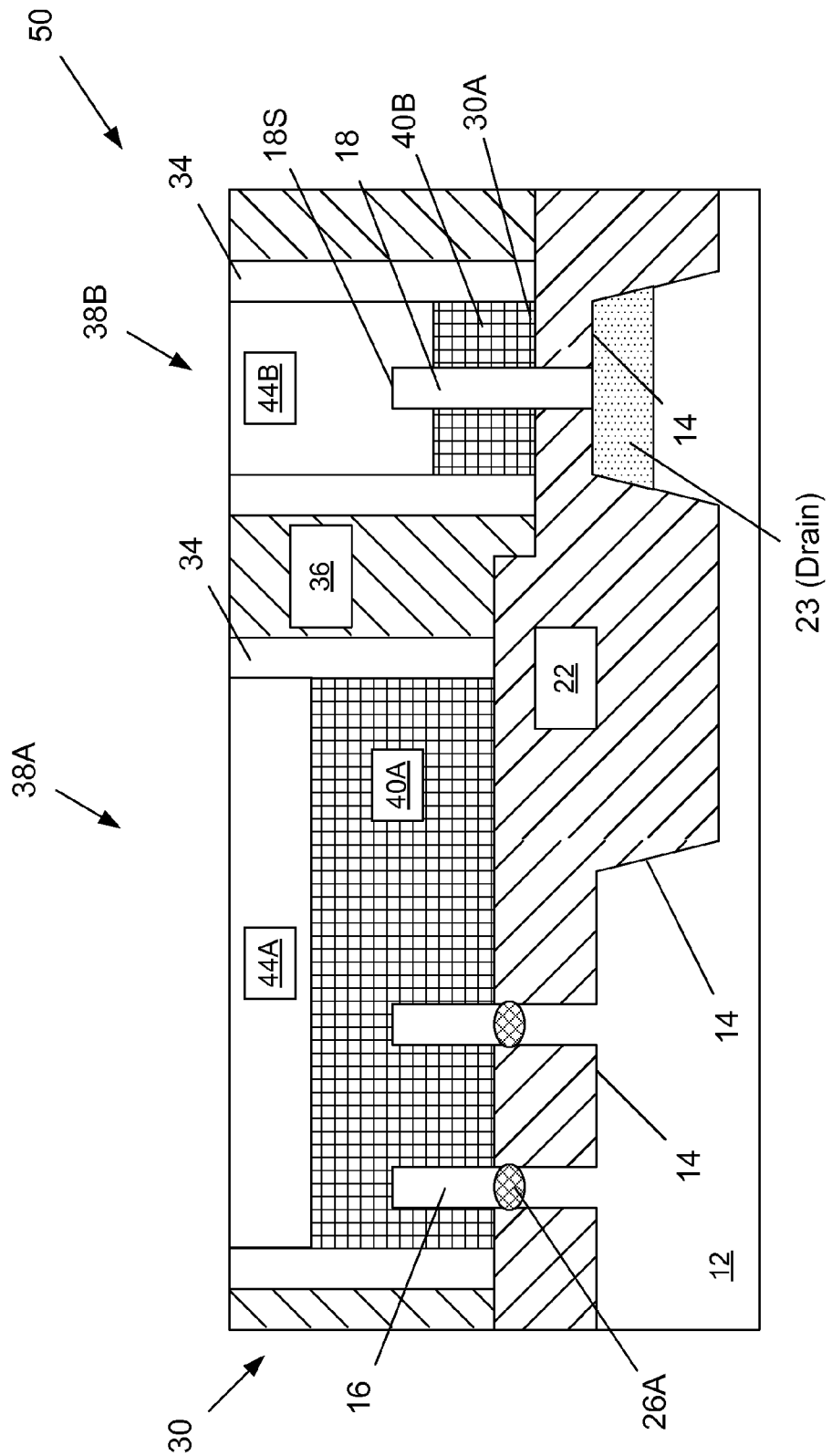
Figure 10:
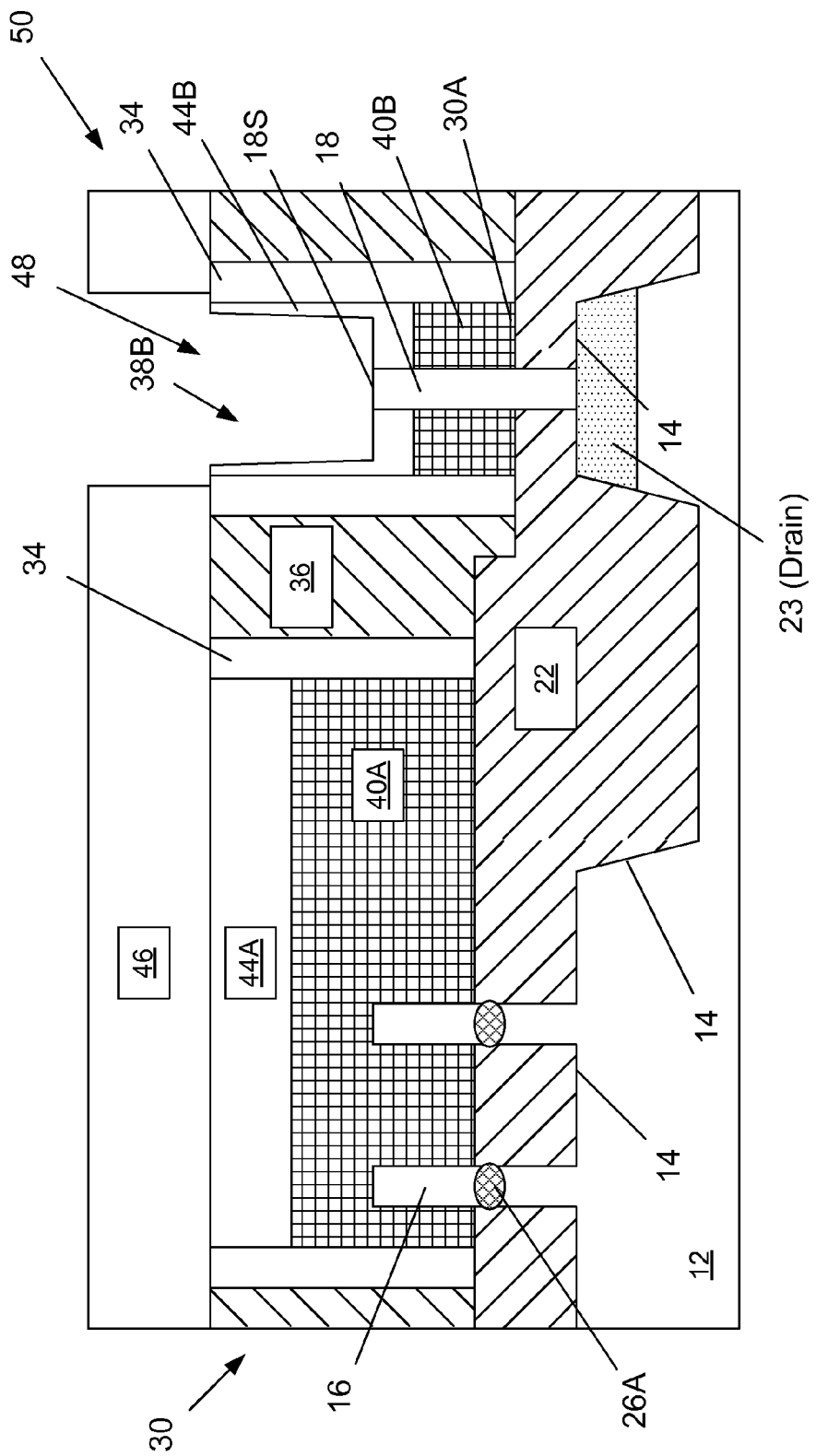

FIG. 1N depicts the product 100 after gate cap layers 44A, 44B (generally referred to with the reference number 44) were formed in the gate cavities 38 for the devices 10, 50, respectively. The gate cap layers 44 may be comprised of a variety of materials, e.g., silicon nitride, and they may be formed by overfilling the remaining portions of the cavities 38 with the gate cap material and thereafter performing a CMP process to remove excess materials.

FIG. 1O depicts the product after several process operations were performed. First, another patterned masking layer 46, e.g., a patterned hard mask layer, was formed above the product 100. The patterned masking layer 46 covers the lateral FinFET device 10 and exposes the vertical FinFET device 50, and, more particularly, it exposes the gate cap layer 44B for the vertical FinFET device 50. Thereafter, a timed, recess etching process was performed to further remove portions of the gate cap layer 44B until such time as a recess 48 was formed in the recessed gate cap layer 44B that exposes the upper surface 18S of the channel structure 18 within the gate cavity 38B.

Figure 1P:
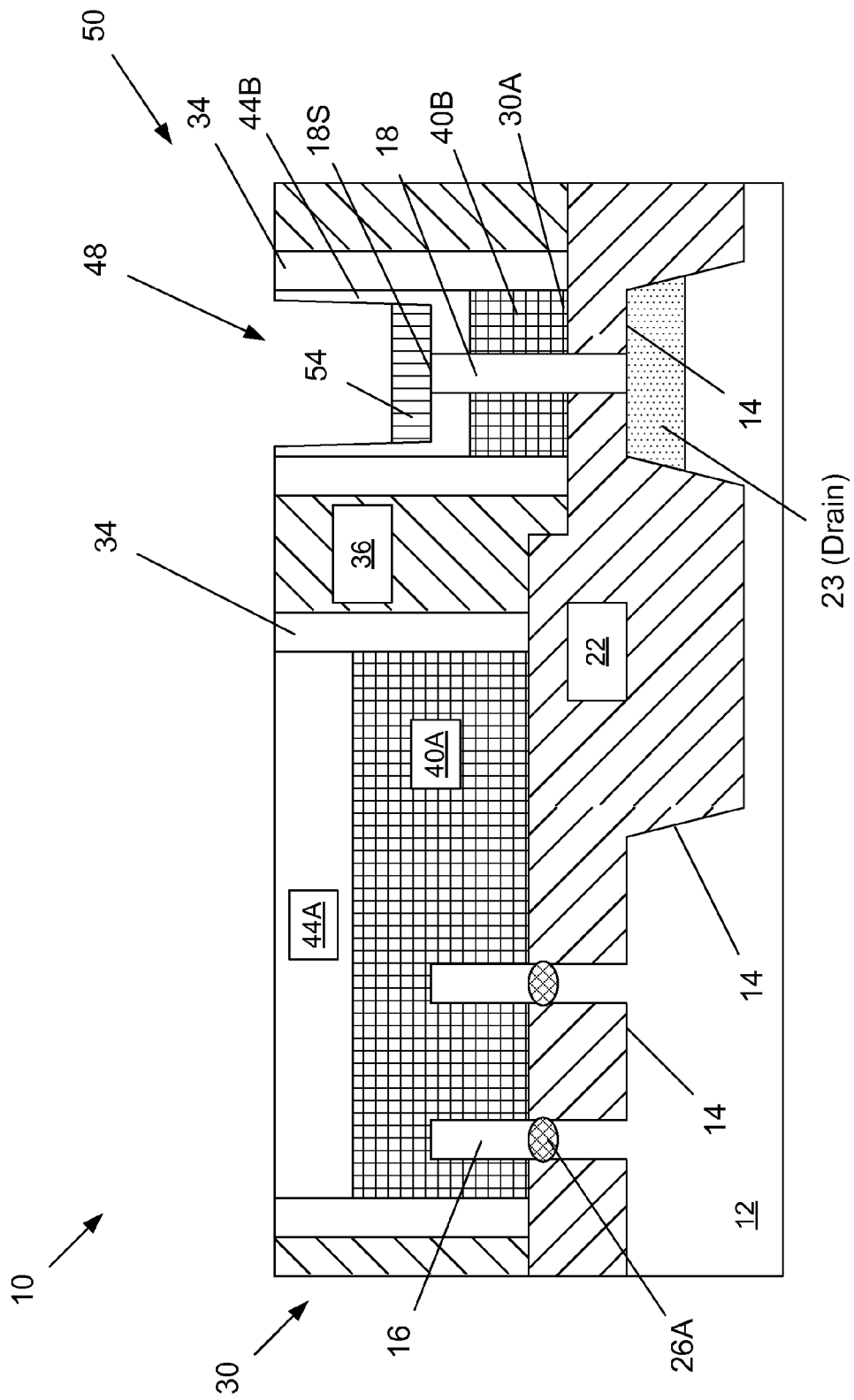

FIG. 1P depicts the product 100 after an epi semiconductor material 54, such as silicon, was formed within the recess 48. In the depicted example, the patterned masking layer 46 was removed prior to the formation of the epi semiconductor material 54, i.e., a situation where the patterned mask layer 46 is comprised of photoresist material. Of course, in the case where the patterned masking layer 46 is made of a hard mask material, such as silicon dioxide, it may remain positioned on the product 100 while the epi semiconductor material 54 is being formed, and such a hard mask layer may remain as part of the final product. For ease of description, the patterned masking layer 46 will be depicted as having been removed prior to the formation of the epi material 54. The epi semiconductor material 54 was formed by performing an epitaxial deposition process using the exposed surface 18S of the channel structure 18 as a template. The vertical thickness of the epi semiconductor material 54 may vary depending upon the particular application. As will be appreciated by those skilled in the art after a complete reading of the present application, the epi semiconductor material 54 will constitute the source region for the vertical FinFET device 50. Thus, the epi semiconductor material 54 may be doped in situ with the appropriate dopant material during the epi growth process, or it may be formed in an undoped condition and then doped by performing an ion implantation process. Although the region 54 is described as being a source region, it is a generic source/drain region that could function as either a drain region or a source region for the vertical FinFET device 50.

Figure 1Q:
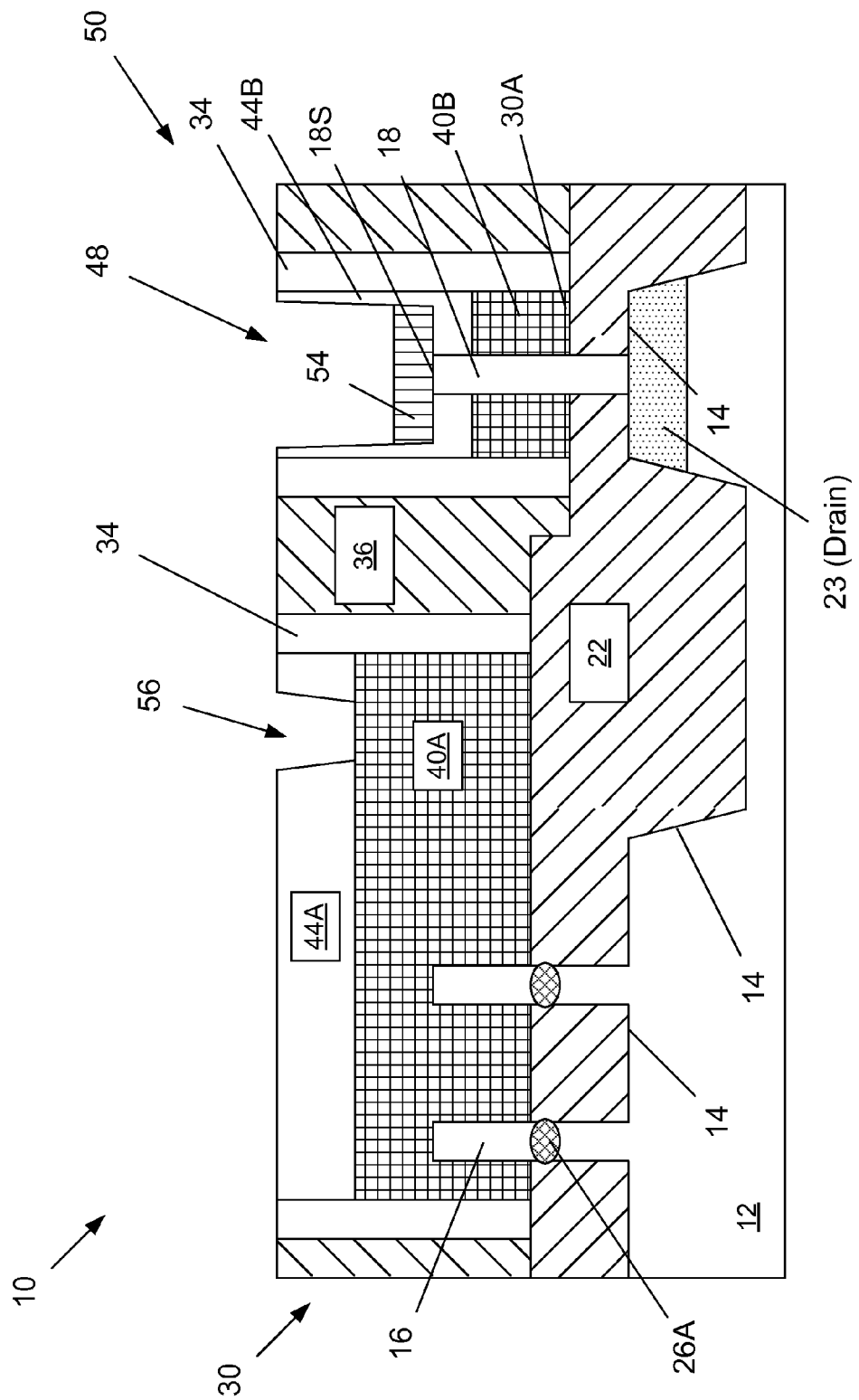

FIG. 1Q depicts the product 100 after another patterned masking layer (not shown) was formed above the product and an etching process was performed through the patterned masking layer to define gate contact opening 56 through the gate cap layer 44A of the lateral FinFET device 10. A similar gate contact opening is formed for the vertical FinFET device 50 at the same time, but that contact opening is not depicted in FIG. 1Q. See FIG. 1U where the gate contact opening 61 has been formed in the gate cap layer 44B for the vertical FinFET device 50.

Figure 1R:
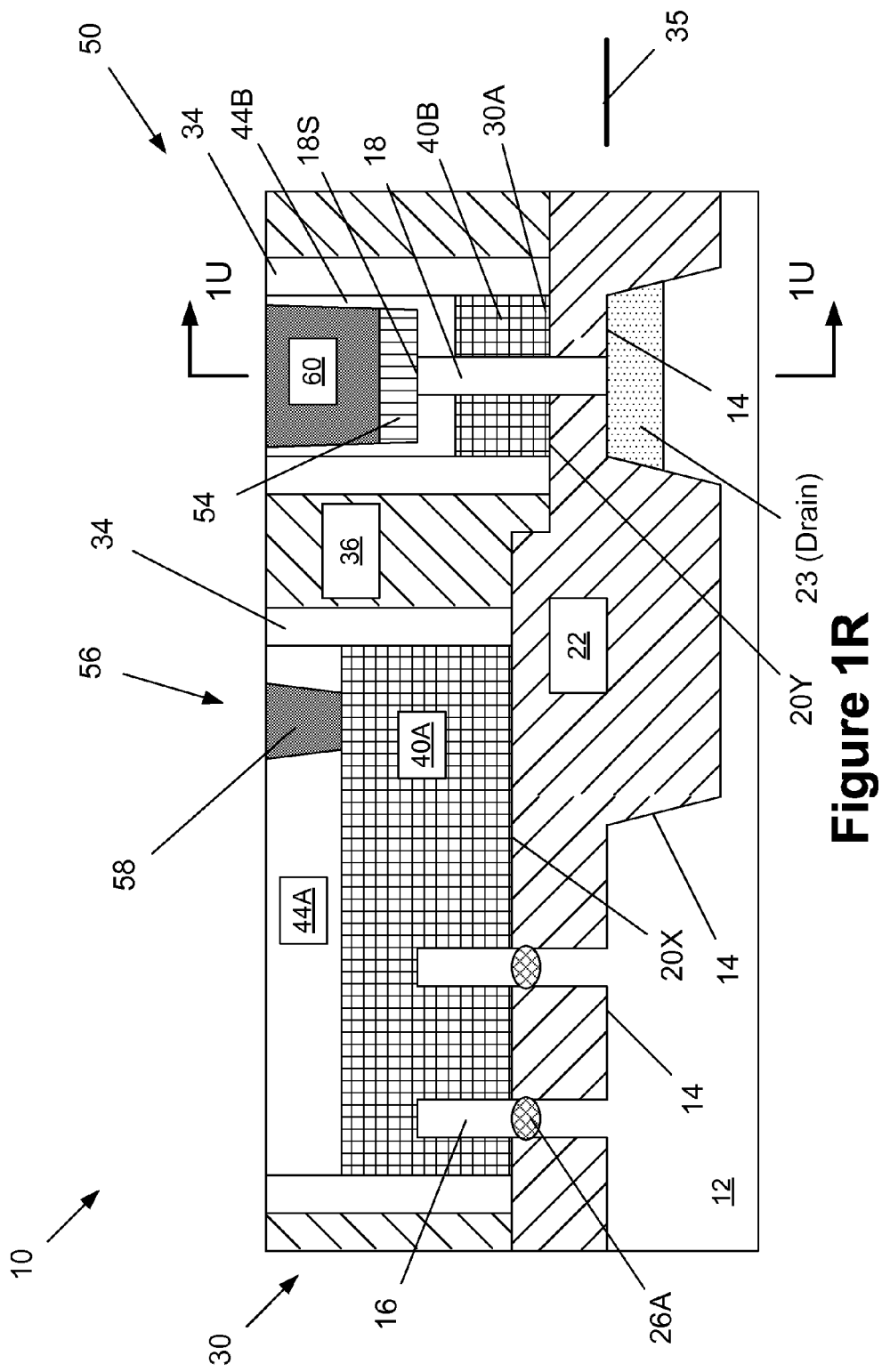
Figure 1S:
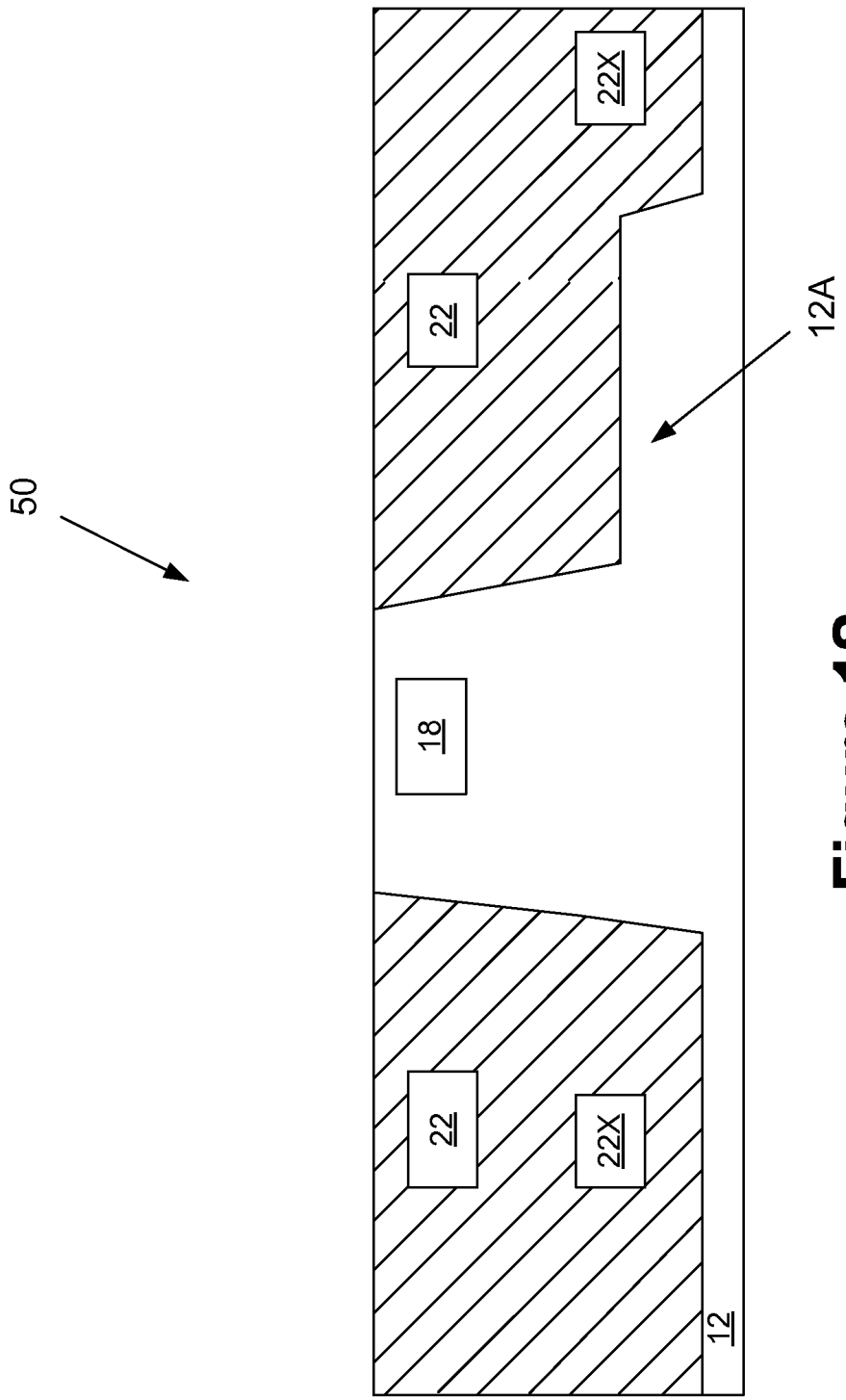
Figure 1T:
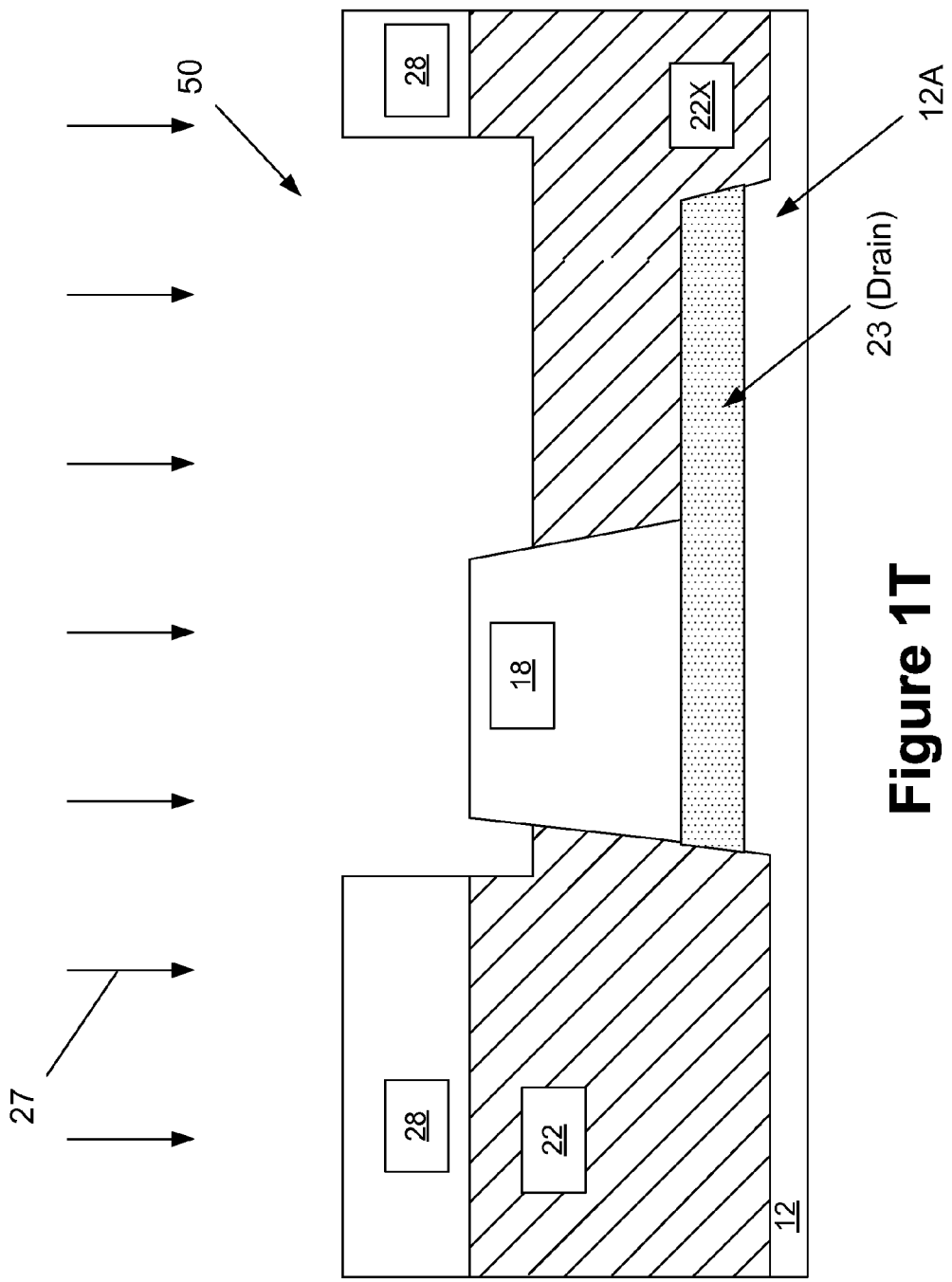
Figure 1U:
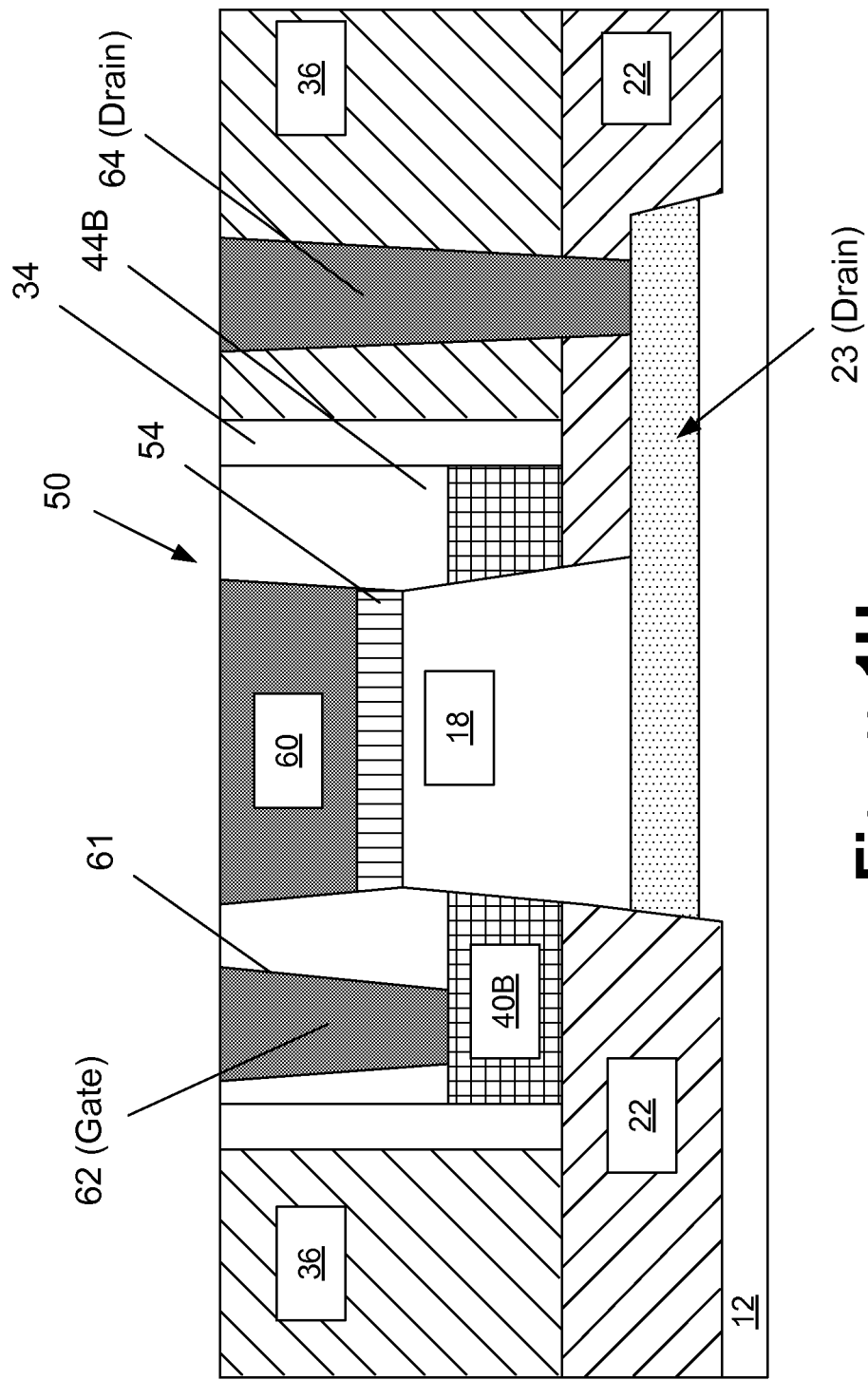

FIGS. 1R and 1U depict the product 100 after one or more schematically depicted conductive materials, e.g., tungsten, were formed in the various openings and recesses in the gate cap layers 44 and the layer of insulating material 36 to define various contact structures to the devices 10, 50. The contact structures were formed by depositing one or more conductive materials in various openings and recesses in the gate cap layers 44 and the layer of insulating material 36, and thereafter performing a CMP process to remove the excess materials. FIG. 1R depicts the formation of the gate contact 58 for the lateral FinFET device 10 and the source/drain contact 60 for the vertical FinFET device 50. FIG. 1U depicts the formation of the gate contact 62 and the source contact 60 in the gate cap layer 44B, as well as the formation of the drain contact 64 in the layer of insulating material 36.

With continuing reference to FIG. 1R, it should be noted that, when viewed in the depicted cross-section, the layer of insulating material 22 is thicker under the gate structure 40A than it is under the gate structure 40B. More specifically, relative to a common horizontally oriented reference surface 35 of the substrate, an upper surface 20X of the layer of insulating material 22 is positioned at a first height level under the gate structure 40A and an upper surface 20Y of the layer of insulating material 22 is positioned under the gate structure 40B at a second height level, wherein the first height level is greater than the second height level.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a lateral FinFET device comprised of a fin structure and a vertical FinFET device comprised of a channel structure, the method comprising:

forming first and second replacement gate cavities for said lateral FinFET device and said vertical FinFET device, respectively;

forming first and second recessed gate structures in said first and second replacement gate cavities;

while masking said first recessed gate structure with a first masking layer, performing a recess etching process on said second recessed gate structure so as to define a further recessed second gate structure and to expose at least a portion of said channel structure within said second replacement gate cavity;

forming first and second gate cap layers in said first and second replacement gate cavities, respectively;

while masking said first gate cap layer with a second masking layer, forming a recess in said second gate cap layer that exposes at least a portion of said channel structure;

forming a semiconductor material on said exposed portion of said channel structure within said recess in said second gate cap layer, said semiconductor material defining a first source/drain region for said vertical FinFET device; and forming a first gate contact structure for said first recessed gate structure, a second gate contact structure for said further recessed second gate structure and a first source/drain contact structure for said first source/drain region of said vertical FinFET device.

2. The method of claim 1, wherein, prior to forming said first and second replacement gate cavities, the method further comprises performing at least one common etching process to define a plurality of trenches in a semiconductor substrate so as to define said fin structure for said lateral FinFET device and said channel structure for said vertical FinFET device.

3. The method of claim 2, wherein, prior to forming said first and second replacement gate cavities, the method comprises:
    masking said lateral FinFET device; and
    performing an ion implantation process to form a second source/drain region for said vertical FinFET device in said semiconductor substrate at least under said channel structure.

4. The method of claim 1, wherein, prior to forming said first and second replacement gate cavities, the method comprises:
    forming first and second sacrificial gate structures above said fin structure and said channel structure, respectively; and
    forming sidewall spacers adjacent said first and second sacrificial gate structures.

5. The method of claim 4, wherein forming said first and second replacement gate cavities comprises removing said first and second sacrificial gate structures.

6. The method of claim 3, further comprising forming a second source/drain contact structure to said second source/drain region of said vertical FinFET device.

7. The method of claim 1, wherein said first source/drain contact region is a source region for said vertical FinFET device.

8. The method of claim 1, wherein said first source/drain contact region is a drain region for said vertical FinFET device.

9. The method of claim 1, wherein the method further comprises forming a source/drain contact structure for a source/drain region of said lateral FinFET device at the same time said first source/drain contact structure for said first source/drain region of said vertical FinFET device is formed.

10. The method of claim 1, wherein said fin structure and said channel structure are formed by performing at least one common etching process through a patterned etch mask to define said fin structure for said lateral FinFET device and said channel structure for said vertical FinFET device in a semiconductor substrate.

11. A method of forming a lateral FinFET device and a vertical FinFET device, comprising:
    performing at least one common etching process to define a fin structure for said lateral FinFET device and a channel structure for said vertical FinFET device in a semiconductor substrate;
    forming first and second recessed gate structures in first and second replacement gate cavities for said lateral FinFET device and said vertical FinFET device, respectively;
    while masking said first recessed gate structure, performing a recess etching process on said second recessed gate structure so as to define a further recessed second gate structure and to expose at least a portion of said channel structure within said second replacement gate cavity;
    forming first and second gate cap layers in said first and second replacement gate cavities, respectively;
    while masking said first gate cap layer, forming a recess in said second gate cap layer that exposes at least a portion of said channel structure;
    forming a semiconductor material on said exposed portion of said channel structure within said recess in said second gate cap layer, said semiconductor material defining a first source/drain region for said vertical FinFET device; and
    forming a first gate contact structure for said first recessed gate structure, a second gate contact structure for said further recessed second gate structure and a first source/drain contact structure for said first source/drain region of said vertical FinFET device.

12. The method of claim 11, wherein, prior to forming said first and second recessed gate structures, the method comprises:
    masking said lateral FinFET device; and
    performing an ion implantation process to form a second source/drain region for said vertical FinFET device in said semiconductor substrate at least under said channel structure.

13. The method of claim 11, wherein, prior to forming said first and second recessed gate structures, the method comprises:
    forming first and second sacrificial gate structures above said fin structure and said channel structure, respectively; and
    forming sidewall spacers adjacent said first and second sacrificial gate structures.

14. The method of claim 13, further comprising removing said first and second sacrificial gate structures so as to form said first and second replacement gate cavities.

15. The method of claim 12, further comprising forming a second source/drain contact structure to said second source/drain region of said vertical FinFET device.

16. A method of forming a lateral FinFET device and a vertical FinFET device, comprising:
    performing at least one common etching process to define a fin structure for said lateral FinFET device and a channel structure for said vertical FinFET device in a semiconductor substrate;
    forming first and second sacrificial gate structures above said fin structure and said channel structure, respectively;
    forming sidewall spacers adjacent said first and second sacrificial gate structures;
    removing said first and second sacrificial gate structures so as to thereby define first and second gate cavities for said lateral FinFET device and said vertical FinFET device, respectively;
    forming first and second recessed gate structures in said first and second gate cavities, respectively;
    forming a first masking layer so as to mask said first recessed gate structure;
    with said first masking layer in position, performing a recess etching process on said second recessed gate structure so as to define a further recessed second gate structure and to expose at least a portion of said channel structure within said second gate cavity;
    removing said first masking layer;
    forming first and second gate cap layers in said first and second gate cavities, respectively;
    forming a second masking layer that masks said first gate cap layer;
    with said second masking layer in position, forming a recess in said second gate cap layer that exposes at least a portion of said channel structure;
    forming a semiconductor material on said exposed portion of said channel structure within said recess in said second gate cap layer, said semiconductor material defining a first source/drain region for said vertical FinFET device; and forming a first gate contact structure for said first recessed gate structure, a second gate contact structure for said further recessed second gate structure and a first source/drain contact structure for said first source/drain region of said vertical FinFET device.

17. The method of claim 16, wherein, prior to forming said first and second sacrificial gate structures, the method comprises:

masking said lateral FinFET device; and performing an ion implantation process to form a second source/drain region in said semiconductor substrate at least under said channel structure.

\* \* \* \* \*